US008877084B2

(12) United States Patent
Zhang et al.

(10) Patent No.: US 8,877,084 B2
(45) Date of Patent: Nov. 4, 2014

(54) METHOD FOR REFRESHING AN ACID BATH SOLUTION

(75) Inventors: Liming Zhang, Greer, SC (US); Hong Zhou, Shanghai (CN); Yanping Liu, Shanghai (CN)

(73) Assignee: General Electric Company, Schenectady, NY (US)

(*) Notice: Subject to any disclaimer, the term of this patent is extended or adjusted under 35 U.S.C. 154(b) by 75 days.

(21) Appl. No.: 13/530,155

(22) Filed: Jun. 22, 2012

(65) Prior Publication Data

US 2013/0341557 A1   Dec. 26, 2013

(51) Int. Cl.
*C23F 1/46*   (2006.01)
*C23F 1/16*   (2006.01)
*H01L 21/67*   (2006.01)
*C23F 1/08*   (2006.01)

(52) U.S. Cl.
CPC ... *C23F 1/46* (2013.01); *C23F 1/16* (2013.01); *H01L 21/67086* (2013.01); *C23F 1/08* (2013.01)
USPC ........................................................ 216/93

(58) Field of Classification Search
CPC .............. C23F 1/46; C23F 1/44; C23F 1/16; C23F 1/00; C23F 1/08; C23F 1/10; H01L 21/67086; C23G 1/36
USPC .............. 134/100.1, 3, 56 R; 148/269, 527; 156/345.1, 345.15, 345.18; 205/673; 210/748.15; 216/96, 93; 252/79.4; 356/436; 438/689, 745, 746; 702/23, 702/25
See application file for complete search history.

(56) References Cited

U.S. PATENT DOCUMENTS

| | | | |
|---|---|---|---|
| 2,662,814 A * | 12/1953 | Swihart .................. 216/108 |
| 6,428,683 B1 | 8/2002 | Jaworowski et al. |
| 6,542,828 B2 | 4/2003 | MacDonald et al. |
| 6,833,328 B1 | 12/2004 | Kool et al. |
| 6,863,738 B2 | 3/2005 | Kool et al. |
| 7,935,642 B2 | 5/2011 | Kool et al. |
| 2002/0197869 A1 | 12/2002 | Nakagawa et al. |
| 2003/0235997 A1* | 12/2003 | Lee et al. ................. 438/745 |
| 2004/0169013 A1 | 9/2004 | Kool et al. |
| 2005/0230045 A1* | 10/2005 | Okuchi et al. ........ 156/345.18 |
| 2009/0132175 A1 | 5/2009 | Kool et al. |

FOREIGN PATENT DOCUMENTS

| | | | |
|---|---|---|---|
| JP | 2004018977 A | 1/2004 |
| JP | 2005187844 A | 7/2005 |
| JP | 2009266893 A | 11/2009 |

OTHER PUBLICATIONS

Search Report and Written Opinion from EP Application No. 13173254.7 dated Oct. 11, 2013.

* cited by examiner

*Primary Examiner* — Duy Deo
*Assistant Examiner* — Erin Bergner
(74) *Attorney, Agent, or Firm* — Dority & Manning, PA

(57) ABSTRACT

A method for refreshing an acid bath solution includes determining a concentration of phosphoric acid in the acid bath solution and determining a concentration of hydrochloric acid in the acid bath solution. The method further includes calculating a volume of phosphoric acid to add to the acid bath solution to achieve a predetermined concentration of phosphoric acid in the acid bath solution. In addition, the method includes calculating a volume of hydrochloric acid to add to the acid bath solution with the volume of phosphoric acid to increase the acid bath solution to a predetermined volume, and adding the volume of phosphoric acid and the volume of hydrochloric acid to the acid bath solution.

20 Claims, 2 Drawing Sheets

METHOD FOR REFRESHING AN ACID BATH SOLUTION

FIELD OF THE INVENTION

The present invention generally involves a method for refreshing an acid bath solution used, for example, in chemically removing protective coatings and/or oxidation deposits. In particular embodiments, the acid bath solution may be used to chemically remove protective coatings and/or oxidation deposits from various gas turbine components.

BACKGROUND OF THE INVENTION

As operating temperatures of gas turbine engines increase to achieve improved fuel efficiency, advanced coatings are applied to various components to enhance thermal barrier protection and aerodynamic performance. The component substrate is usually a polymer, a ceramic, or a metal, such as a super alloy. Current coatings used on components in gas turbine hot sections, such as blades, nozzles, combustors, and transition pieces, generally belong to one of two classes: diffusion coatings and overlay coatings. Diffusion coatings are generally formed of aluminide-type alloys, such as nickel-aluminide, platinum-aluminide, or nickel-platinum-aluminide. Diffusion coatings are formed by depositing the coating onto the substrate and reacting the coating with the underlying substrate by high temperature diffusion. In contrast, overlay coatings are generally deposited intact, without reaction with the underlying substrate. Overlay coatings typically have the composition MCrAl(X), where M is an element from the group consisting of Ni, Co, Fe, and combinations thereof, and X is an element from the group consisting of Y, Ta, Si, Hf, Ti, Zr, B, C, and combinations thereof.

It has become commonplace to repair or refurbish gas turbine components, particularly airfoils, and return those components to service. During repair, protective coatings and oxidation deposits are removed as much as practicable to allow for inspection and repair of the underlying substrate. Various methods are known in the art for chemically cleaning the substrate. For example, U.S. Pat. Nos. 6,833,328; 6,863,738; and 7,935,642, all assigned to the same assignee as the present application, disclose various aqueous solutions containing phosphoric acid, nitric acid, sulfuric acid, hydrochloric acid, hydrofluoric acid, hydrobromic acid, hydriodic acid, acetic acid, perchloric acid, phosphorous acid, phosphinic acid, alkyl sulfonic acids, and mixtures and precursors thereof to chemically clean substrates. Relative motion between the aqueous solution and the substrate permits enhanced contact between the aqueous solution and the substrate. In some embodiments, for example, the aqueous solution may be continuously sprayed onto the substrate using various types of spray guns. Alternatively, the aqueous solution may be poured over the substrate and/or the substrate may be submerged in an acid bath containing the aqueous solution. Immersion time and bath temperature will depend on many factors, such as the type of coating being removed and the acid (or acids) included in the acid bath solution.

The acid bath solution removes the protective coatings and oxidation deposits on the substrate by dissolution reactions that produce metal salts of the constituent acids. The dissolution reactions and accompanying evaporation of the volatile acids gradually deplete the concentration and effectiveness of the acid bath solution, increasing the cycle time for cleaning the substrate and/or disposal costs associated with disposing the depleted aqueous solution. As a result, a method for refreshing, replenishing, or rejuvenating the acid bath solution may be useful to reducing the cycle time, extending the effectiveness of the aqueous solution, and/or reducing associated disposal costs.

BRIEF DESCRIPTION OF THE INVENTION

Aspects and advantages of the invention are set forth below in the following description, or may be obvious from the description, or may be learned through practice of the invention.

One embodiment of the present invention is a method for refreshing an acid bath solution that includes determining a concentration of phosphoric acid in the acid bath solution and determining a concentration of hydrochloric acid in the acid bath solution. The method further includes calculating a volume of phosphoric acid to add to the acid bath solution to achieve a predetermined concentration of phosphoric acid in the acid bath solution. In addition, the method includes calculating a volume of hydrochloric acid to add to the acid bath solution with the volume of phosphoric acid to increase the acid bath solution to a predetermined volume, and adding the volume of phosphoric acid and the volume of hydrochloric acid to the acid bath solution.

Another embodiment of the present invention is a method for refreshing an acid bath solution that includes determining a concentration of phosphoric acid in the acid bath solution and determining a concentration of hydrochloric acid in the acid bath solution. The method further includes calculating a volume of phosphoric acid to add to the acid bath solution to achieve a predetermined concentration of phosphoric acid in the acid bath solution, calculating a volume of hydrochloric acid to add to the acid bath solution with the volume of phosphoric acid to increase the acid bath solution to a predetermined volume, and calculating a resulting concentration of hydrochloric acid in the acid bath solution if the volume of phosphoric acid and the volume of hydrochloric acid were added to the acid bath solution. The method further includes draining a portion of the acid bath solution if at least one of the following conditions exist: the volume of phosphoric acid is less than zero; the resulting concentration of hydrochloric acid does not exceed a predetermined concentration of hydrochloric acid; or a sum of the predetermined concentration of phosphoric acid and the resulting concentration of hydrochloric acid in the acid bath solution does not exceed a first predetermined limit.

The present invention may also include a method for refreshing an acid bath solution that includes draining a portion of the acid bath solution to create a remaining acid bath solution, determining a concentration of phosphoric acid in the remaining acid bath solution, and determining a concentration of hydrochloric acid in the remaining acid bath solution. The method may further include calculating a volume of phosphoric acid to add to the remaining acid bath solution to achieve a predetermined concentration of phosphoric acid in the remaining acid bath solution, calculating a volume of hydrochloric acid to add to the remaining acid bath solution with the volume of phosphoric acid to increase the remaining acid bath solution to a predetermined volume, and adding the volume of phosphoric acid and the volume of hydrochloric acid to the remaining acid bath solution.

Those of ordinary skill in the art will better appreciate the features and aspects of such embodiments, and others, upon review of the specification.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE INVENTION

Figure 1:
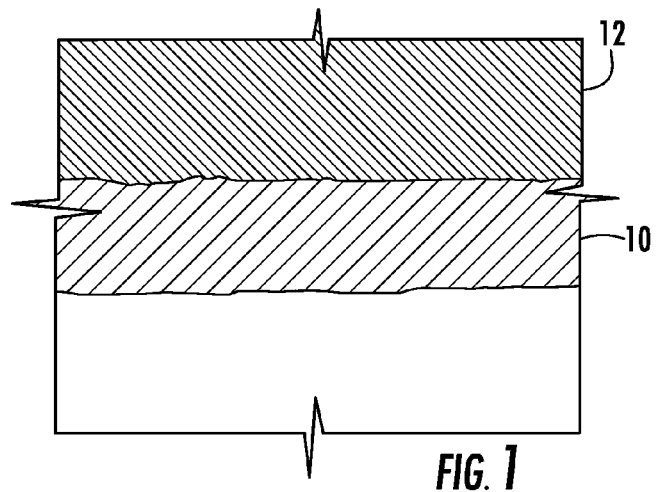
FIG. 1 is an exemplary side cross-section view of a protective coating on a substrate.

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention. As used herein, the terms "first", "second", and "third" may be used interchangeably to distinguish one component from another and are not intended to signify location or importance of the individual components. In addition, the terms "upstream" and "downstream" refer to the relative location of components in a fluid pathway. For example, component A is upstream from component B if a fluid flows from component A to component B. Conversely, component B is downstream from component A if component B receives a fluid flow from component A.

Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

Various embodiments of the present invention include a method for refreshing an acid bath solution. The acid bath solution may be circulated through an acid bath or similar structure, for example, to remove protective coatings and/or oxidation deposits from various substrates. In particular embodiments, the acid bath solution may include various amounts of one or more acids known in the art for chemically removing protective coatings and/or oxidation deposits from gas turbine components. For example, the acid bath solution may include approximately equal amounts by volume of phosphoric acid and hydrochloric acid in an aqueous solution. The phosphoric and hydrochloric acids chemically react with the protective coatings and/or oxidation deposits to dissolve or otherwise remove the coatings and/or deposits from a surface of the component being cleaned.

FIG. 1 provides an exemplary side cross-section view of a protective coating 10 on a substrate 12. As shown, the protective coating 10 may overlay the substrate 12 to protect the substrate 12 from erosion, pitting, and/or excessive temperatures. Typical overlay coatings may have the composition MCrAl(X), where M is an element from the group consisting of Ni, Co, Fe, and combinations thereof, and X is an element from the group consisting of Y, Ta, Si, Hf, Ti, Zr, B, C, and combinations thereof.

The substrate 12 may be immersed in an acid bath containing the acid bath solution. The size of the acid bath will vary according to the particular application and number of individual components immersed during each batch. For example, the acid bath may have a volume of 500 liters to more than 4000 liters, depending on the particular application. The acid bath solution may be maintained over a wide temperature range, for example, from approximately 20 degrees Celsius to more than 100 degrees Celsius while the substrate is immersed therein. The cycle time of immersion may vary considerably, depending on the strength of the acid bath solution, temperatures, type of coatings, thickness of the coatings, and many other variables. For example, the immersion cycle time may range from approximately 10 minutes to more than 72 hours.

Over time, the acid bath solution becomes less effective as the phosphoric and hydrochloric acids are depleted through chemical reactions and evaporation. For example, the acid bath solution may begin with a combined percent by volume concentration of between approximately 75% and 95% of equal amounts of phosphoric acid and hydrochloric acid. As the phosphoric acid and hydrochloric acid deplete by chemical reaction and the hydrochloric acid also depletes through evaporation, the percent by volume concentrations of the constituent acids decrease, decreasing the effectiveness of the acid bath solution. The less effective acid bath solution extends the amount of time required for each immersion cycle to achieve the same results, increasing the amount of time to refurbish the component and return the component to service.

Lab-scale experiments indicate that the effectiveness of the acid bath solution is directly related to the percent by volume concentrations of the constituent acids. As a result, the immersion cycle time and disposal costs can be reduced if the acid bath solution can be efficiently and reliably refreshed on a periodic basis to increase the percent by volume concentrations of the constituent acids.

Figure 2:
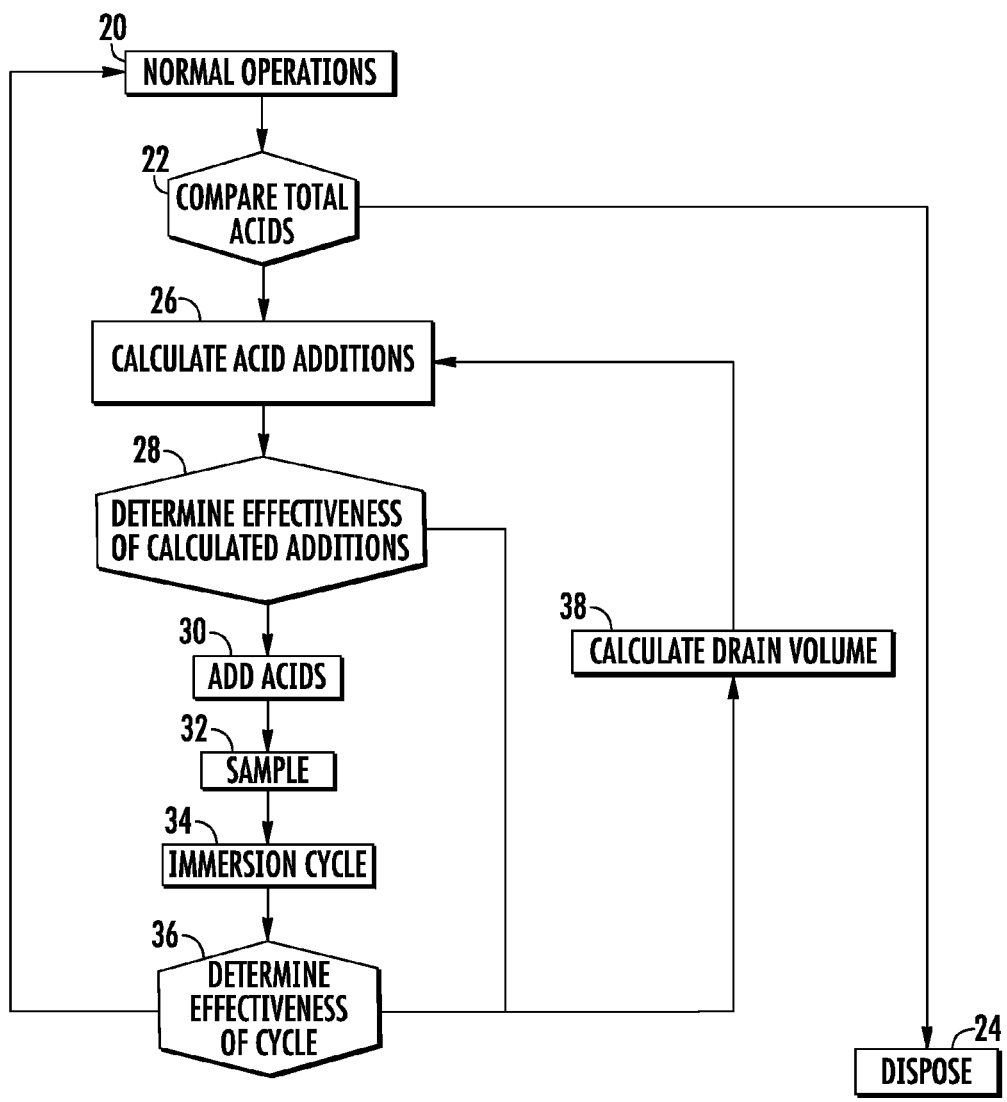
FIG. 2 is a flow diagram of a method for refreshing an acid bath solution according to various embodiments of the present invention.

FIG. 2 provides a flow diagram of a method for refreshing the acid bath solution according to various embodiments of the present invention. Block 20 represents normal operations of the acid bath solution to chemically remove various protective coatings 10 and/or oxidation deposits from the substrate 12. During normal operations, the acid bath solution may be periodically sampled or otherwise measured to determine the concentration of the constituent acids in the acid bath solution. For example, samples of the acid bath solution may be analyzed daily, after each immersion cycle, and/or whenever the effectiveness of the acid bath solution appreciably decreases. The analysis of the acid bath solution may include titrations, weight measurements, or any other quantitative analyses known in the art for accurately determining the concentration of the constituent acids in solution. The concentration of the constituent acids may be expressed in various known units of concentration, including molarity, molality, percent by weight, or percent by volume, and the present invention is not limited to any particular units of concentration unless specifically recited in the claims.

At block 22, the method may compare the concentration of one or more of the constituent acids to a first predetermined limit to determine whether it is preferable to refresh the acid bath solution or to simply dispose of the acid bath solution and replace it with a new acid bath solution. For example, in particular embodiments, the method may compare a concentration of phosphoric acid in the acid bath solution, a concentration of hydrochloric acid in the acid bath solution, and/or a sum of the concentrations of phosphoric acid and hydrochloric acid in the acid bath solution to the first predetermined limit. The first predetermined limit will depend on various factors used to determine whether refreshing or disposing the acid bath solution is more preferable, cost effective, and/or easiest to accomplish. For example, the first predetermined limit may depend on which constituent acid is compared, the initial concentration in the acid bath solution, the immersion cycle time, the type and/or thickness of the coatings, and many other fact specific variables. In particular embodiments, for example, the first predetermined limit may be between 25% and 50% by volume for individual constituent acid concentrations and/or between 50% and 95% by volume for the combined concentrations of phosphoric acid and hydrochloric acid in the acid bath solution. In still further embodiments, the first predetermined limit may be 65% by volume for the combined concentrations of phosphoric acid and hydrochloric acid in the acid bath solution.

If the concentration of one or more of the constituent acids is less than the first predetermined limit, then the method may result in disposing the acid bath solution and preparing a new batch of acid bath solution, indicated by block 24 in FIG. 2. Otherwise, the method may proceed to block 26 in FIG. 2 in which the method may calculate the amount of each constituent acid needed to be added to the acid bath solution to adequately refresh the acid bath solution. In particular embodiments, for example, the method may calculate the volume of one constituent acid needed to achieve a predetermined final concentration for that constituent acid in the acid bath solution and then calculate the volume and resulting concentration(s) of the other constituent acid(s) needed to achieve a desired volume in the acid bath. In the case of an acid bath solution of phosphoric and hydrochloric acids, for example, the method may calculate the volume of phosphoric acid needed to achieve a predetermined final concentration of phosphoric acid in the acid bath solution according to the following equation:

$$V_A = [H_3PO_4]_f * V_f - [H_3PO_4]_i * V_i$$

where $V_i$ is the initial volume of the acid bath solution, $[H_3PO_4]_i$ is the initial concentration of phosphoric acid in the acid bath solution, $V_f$ is the final volume of the acid bath solution, $[H_3PO_4]_f$ is the predetermined final concentration of phosphoric acid in the acid bath solution, and $V_A$ is the volume of 85% by weight phosphoric acid to add to the acid bath solution. In particular embodiments, the predetermined final concentration of phosphoric acid $[H_3PO_4]_f$ in the acid bath solution may be 36% by volume or between 30% and 50% by volume.

The method may then calculate the volume and resulting concentration of hydrochloric acid needed to completely fill the acid bath as follows:

$$V_B = V_f - V_i - V_A$$

$$[HCl]_f = ([HCl]_i * V_i + V_B) / V_f$$

where $V_B$ is the volume of 22 percent Baume hydrochloric acid to add to the acid bath solution; $[HCl]_i$ is the initial concentration of hydrochloric acid in the acid bath solution; and $[HCl]_f$ is the resulting concentration of hydrochloric acid in the acid bath solution.

At block 28, the method may use the calculations performed in block 26 to determine if the calculated additions will be effective at refreshing the acid bath solution. For example, the method may compare the calculated volumes of the constituent acids to add to the acid bath solution and/or the resulting concentrations of the constituent acids to one or more predetermined limits to determine if the additions will sufficiently refresh the acid bath solution or if the acid bath solution should first be drained to create additional volume for more of the constituent acids to be added to the acid bath solution. In the case of an acid bath solution of phosphoric and hydrochloric acids, for example, if the calculated volume of phosphoric acid $V_A$ is less than zero, then the method may proceed with draining a portion of the acid bath solution to allow for additional phosphoric acid to be added to the acid bath solution, as indicated by block 38. Alternately or in addition, if the resulting concentration of hydrochloric acid $[HCl]_f$ in the acid bath solution does not exceed a predetermined concentration of hydrochloric acid, then the method may proceed with draining a portion of the acid bath solution to allow for additional hydrochloric acid to be added to the acid bath solution, as indicated by block 38. In particular embodiments, the predetermined concentration of hydrochloric acid may be 31% by volume or between 30% and 50% by volume. In still further embodiments, if a sum of the predetermined final concentration of phosphoric acid $[H_3PO_4]_f$ and the resulting concentration of hydrochloric acid $[HCl]_f$ in the acid bath solution does not exceed a predetermined limit, then the method may proceed with draining a portion of the acid bath solution to allow for one or more additional constituent acids to be added to the acid bath solution, as indicated by block 38. In particular embodiments, the predetermined limit may be 72% by volume or between 60% and 95% by volume.

If the comparisons performed at block 28 indicate that the calculated additions will be effective at refreshing the acid bath solution, then the method may proceed with adding the calculated volumes of the constituent acids, as indicated by block 30. At block 32, the acid bath solution may again be sampled or otherwise measured to determine the concentrations of the constituent acids in the acid bath solution prior to an immersion cycle. This additional sample may serve to verify or confirm the accuracy of the chemical additions and avoid inadvertent damage to the substrates 12 in the event of an error in any of the previous measurements, calculations, or additions. At block 34, an immersion cycle may be performed using the refreshed acid bath solution.

Figure 3:
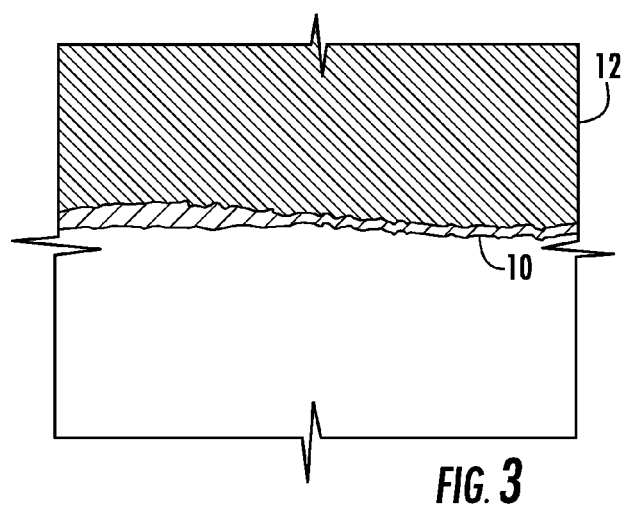
FIG. 3 is an exemplary side cross-section view of the substrate shown in FIG. 1 with <85% of the protective coating removed.
Figure 4:
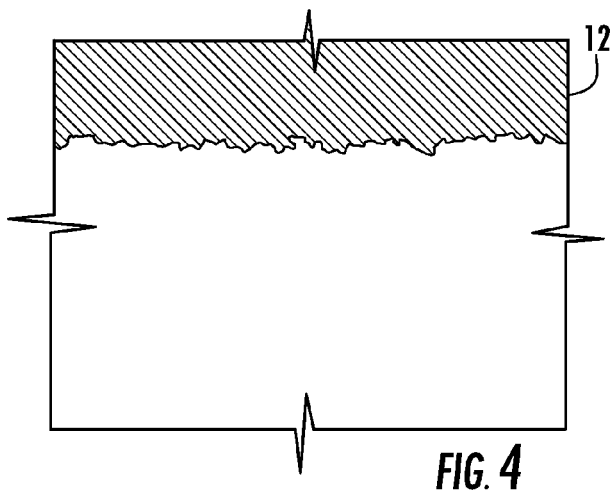
FIG. 4 is an exemplary side cross-section view of the substrate shown in FIG. 1 with >85% of the protective coating removed.

At the conclusion of the immersion cycle, the substrate 12 may be inspected to determine the actual effectiveness of the refreshed acid bath solution, as indicated by block 36. The criteria for the effectiveness of the refreshed acid bath solution may be objective and/or subjective. For example, the effectiveness of the refreshed acid bath solution may be objectively measured by the amount of time required for each immersion cycle to achieve a measurable result. Alternately or in addition, the effectiveness of the refreshed acid bath solution may be objectively or subjectively measured by the amount of coating or deposits that remain on the surface of the substrate 12. For example, FIG. 3 provides an exemplary side cross-section view of the substrate 12 shown in FIG. 1 with <85% of the protective coating 10 removed from the surface which may indicate a less effective immersion cycle or acid bath solution. In contrast, FIG. 4 provides an exemplary side cross-section view of the substrate 12 shown in FIG. 1 with >85% of the protective coating 10 removed, indicating a more effective immersion cycle or acid bath solution.

If the inspection of the substrate 12 performed in block 36 indicates that the acid bath solution is effective, then the method may return to block 20 and resume normal operations. Conversely, if the inspection of the substrate 12 performed in block 36 indicates that the acid bath solution is not effective or if one or more of the comparisons performed at block 28 indicate that the calculated additions will not be effective at refreshing the acid bath solution, then the method may proceed with draining a portion of the acid bath solution to allow for one or more additional constituent acids to be added to the acid bath solution, as indicated by block 38.

At block 38, the method calculates the amount of acid bath solution to drain to make room for additional constituent acids to be added to the acid bath solution according to the following equation:

$$V_d = V_f * (1 - [H_3PO_4]_f - [HCl]_f)/(1 - [H_3PO_4]_i - [HCl]_i)$$

where $[HCl]_i$ is the initial concentration of the hydrochloric acid in the acid bath solution; $[H_3PO_4]_i$ is the initial concentration of phosphoric acid in the acid bath solution; $[HCl]_f$ is the desired concentration of hydrochloric acid in the acid bath solution; $[H_3PO_4]_f$ is the desired concentration of phosphoric acid in the acid bath solution; $V_f$ is the is the final volume of the acid bath solution; and $V_d$ is the volume to drain the acid bath to.

The acid bath may then be drained to the calculated volume $V_d$, and the method may return to block 26 to calculate the amount of each constituent acid needed to be added to the acid bath solution to adequately refresh the acid bath solution. For example, the method may determine the concentrations of phosphoric acid and hydrochloric acid in the remaining acid bath solution and calculate the volumes of phosphoric acid and hydrochloric acid to add to the remaining acid bath solution to adequately refresh the acid bath solution, as previously described with respect to block 26. The method may then continue with the comparisons previously described with respect to block 28 to determine if the calculated additions will be effective at refreshing the acid bath solution.

The following hypothetical examples are provided to illustrate the possible flow paths of the method shown in FIG. 2. In each example, the first predetermined limit for the combined concentrations of phosphoric acid and hydrochloric acid in the acid bath solution is 65% by volume, the predetermined final phosphoric acid concentration $[H_3PO_4]_f$ is 36% by volume, the predetermined concentration of hydrochloric acid is 31% by volume, and the predetermined limit for the sum of the predetermined final concentration of phosphoric acid $[H_3PO_4]_f$ and the resulting concentration of hydrochloric acid $[HCl]_f$ in the acid bath solution is 72% by volume.

EXAMPLE 1

An acid bath solution is sampled, and titrations of the sample indicate a phosphoric acid concentration $[H_3PO_4]_i$ of 36% by volume and a hydrochloric acid concentration $[HCl]_i$ of 27% by volume.

Performing the comparison previously described for block 22, the method compares the combined concentrations of phosphoric acid and hydrochloric acid in the acid bath solution to the first predetermined limit of 65% by volume. Since the combined concentrations of phosphoric acid and hydrochloric acid in the acid bath solution is 63% by volume and less than the first predetermined limit of 65% by volume, the acid bath solution is disposed and replaced with a new acid bath solution, as indicated by block 24.

EXAMPLE 2

An acid bath solution is sampled, and titrations of the sample indicate a phosphoric acid concentration $[H_3PO_4]_i$ of 37.4% by volume and a hydrochloric acid concentration $[HCl]_i$ of 32.5% by volume. The initial volume of the acid bath solution $V_i$ is 1750 liters, and the total volume of the acid bath $V_f$ is 1900 liters.

Performing the comparison previously described for block 22, the method compares the combined concentrations of phosphoric acid and hydrochloric acid in the acid bath solution to the first predetermined limit of 65% by volume. Since the combined concentrations of phosphoric acid and hydrochloric acid in the acid bath solution is 69.9% by volume and more than the first predetermined limit of 65% by volume, the method proceeds with the volume and concentration calculations previously described for block 26.

At block 26, the calculated volume of phosphoric acid $V_A$ to add to the acid bath solution is 29.5 liters. The calculated volume of hydrochloric acid $V_B$ to add to the acid bath solution is 120.5 liters, and the calculated resulting hydrochloric acid concentration $[HCl]_f$ is 36.3% by volume.

The method then performs the comparisons previously described with respect to block 28. Specifically, the calculated volume of phosphoric acid $V_A$ to add is 29.5 liters, which is greater than 0. The calculated resulting hydrochloric acid concentration $[HCl]_f$ is 36.3% by volume which is greater than the predetermined concentration of hydrochloric acid of 31% by volume. The sum of the predetermined final concentration of phosphoric acid $[H_3PO_4]_f$ and the resulting concentration of hydrochloric acid $[HCl]_f$ in the acid bath solution is 72.3% by volume which is greater than the predetermined limit of 72% by volume. As a result, the method continues with block 30 in which the calculated volumes of phosphoric acid and hydrochloric acid are added to the acid bath solution.

EXAMPLE 3

An acid bath solution is sampled, and titrations of the sample indicate a phosphoric acid concentration $[H_3PO_4]_i$ of 38% by volume and a hydrochloric acid concentration $[HCl]_i$ of 29% by volume. The initial volume of the acid bath solution $V_i$ is 1750 liters, and the total volume of the acid bath $V_f$ is 1900 liters.

Performing the comparison previously described for block 22, the method compares the combined concentrations of phosphoric acid and hydrochloric acid in the acid bath solution to the first predetermined limit of 65% by volume. Since the combined concentrations of phosphoric acid and hydrochloric acid in the acid bath solution is 67% by volume and more than the first predetermined limit of 65% by volume, the method proceeds with the volume and concentration calculations previously described for block 26.

At block 26, the calculated volume of phosphoric acid $V_A$ to add to the acid bath solution is 19 liters. The calculated volume of hydrochloric acid $V_B$ to add to the acid bath solution is 131 liters, and the calculated resulting hydrochloric acid concentration $[HCl]_f$ is 33.6% by volume.

The method then performs the comparisons previously described with respect to block 28. Specifically, the calculated volume of phosphoric acid $V_A$ to add is 19 liters, which is greater than 0. The calculated resulting hydrochloric acid concentration $[HCl]_f$ is 33.6% by volume which is greater than the predetermined concentration of hydrochloric acid of 31% by volume. However, the sum of the predetermined final concentration of phosphoric acid $[H_3PO_4]_f$ and the resulting concentration of hydrochloric acid $[HCl]_f$ in the acid bath solution is 69.6% by volume which is less than the predetermined limit of 72% by volume. As a result, the method continues with block 38 to calculate the amount of acid bath solution to drain to make room for additional constituent acids to be added to the acid bath solution.

At block 38, the calculated volume $V_d$ to drain the acid bath to is 1612 liters. The method then returns to the volume and concentration calculations previously described for block 26.

At block 26, the calculated volume of phosphoric acid $V_A$ to add to the acid bath solution is 71 liters. The calculated volume of hydrochloric acid $V_B$ to add to the acid bath solution is 216 liters, and the calculated resulting hydrochloric acid concentration $[HCl]_f$ is 36% by volume.

The method then again performs the comparisons previously described with respect to block 28. Specifically, the calculated volume of phosphoric acid $V_A$ to add is 71 liters, which is greater than 0. The calculated resulting hydrochloric acid concentration $[HCl]_f$ is 36% by volume which is greater than the predetermined concentration of hydrochloric acid of 31% by volume. The sum of the predetermined final concentration of phosphoric acid $[H_3PO_4]_f$ and the resulting concentration of hydrochloric acid $[HCl]_f$ in the acid bath solution is 72% by volume which is equal to the predetermined limit of 72% by volume. As a result, the method continues with block 30 in which the calculated volumes of phosphoric acid and hydrochloric acid are added to the acid bath solution.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other and examples are intended to be within the scope of the claims if they include structural elements that do not differ from the literal language of the claims, or if they include equivalent structural elements with insubstantial differences from the literal languages of the claims.

What is claimed is:

1. A method for refreshing an acid bath solution comprising:
   a. determining a concentration of phosphoric acid in as sample of the acid bath solution via titration;
   b. determining a concentration of hydrochloric acid in the sample of the acid bath solution via titration;
   c. calculating a volume of phosphoric acid to add to the acid bath solution to achieve a predetermined concentration of phosphoric acid in the acid bath solution based upon the concentration of the phosphoric acid;
   d. calculating a volume of hydrochloric acid to add to the acid bath solution with the volume of phosphoric acid based upon the concentration of the hydrochloric acid to increase the acid bath solution to a predetermined volume; and
   e. adding the volume of phosphoric acid and the volume of hydrochloric acid to the acid bath solution.

2. The method as in claim 1, wherein the predetermined concentration of phosphoric acid in the bath solution is between 30% and 50% by volume.

3. The method as in claim 1, further comprising draining a portion of the acid bath solution if the volume of phosphoric acid is less than zero.

4. The method as in claim 1, further comprising calculating a resulting concentration of hydrochloric acid in the acid bath solution if the volume of phosphoric acid and the volume of hydrochloric acid were added to the acid bath solution, and draining a portion of the acid bath solution if the resulting concentration of hydrochloric acid does not exceed a predetermined concentration of hydrochloric acid.

5. The method as in claim 4, wherein the predetermined concentration of hydrochloric acid is between 30% and 50% by volume.

6. The method as in claim 1, further comprising calculating a resulting concentration of hydrochloric acid in the acid bath solution if the volume of phosphoric acid and the volume of hydrochloric acid were added to the acid bath solution, and draining a portion of the acid bath solution if a sum of the predetermined concentration of phosphoric acid and the resulting concentration of hydrochloric acid in the acid bath solution does not exceed a first predetermined limit.

7. The method as in claim 6, wherein the first predetermined limit is between 60% and 95% by volume.

8. The method as in claim 1, further comprising draining a portion of the acid bath solution if the effectiveness of the acid bath solution is below a predetermined performance standard.

9. The method as in claim 8, wherein the predetermined performance standard is a function of a surface area of a substrate.

10. The method as in claim 1, further comprising discharging the acid bath solution if a sum of the concentration of phosphoric acid and the concentration of hydrochloric acid in the acid bath solution is less than a second predetermined limit.

11. The method as in claim 10, wherein the second predetermined limit is between 50% and 95% by volume.

12. A method for refreshing an acid bath solution comprising:
   a. determining a concentration of phosphoric acid in a sample of the acid bath solution via titration;
   b. determining a concentration H of hydrochloric acid in the sample of the acid bath solution via titration;
   c. calculating a volume of phosphoric acid to add to the acid bath solution to achieve a predetermined concentration of phosphoric acid in the acid bath solution based upon the concentration of the phosphoric acid;
   d. calculating a volume of hydrochloric acid based upon the concentration of the hydrochloric acid to add to the acid bath solution with the volume of phosphoric acid to increase the acid bath solution to a predetermined volume;
   e. calculating a resulting concentration of hydrochloric acid in the acid bath solution if the volume of phosphoric acid and the volume of hydrochloric acid were added to the acid bath solution; and
   f. draining a portion of the acid bath solution if at least one of the following conditions exist;
      i. the volume of phosphoric acid is less than zero;
      ii. the resulting concentration of hydrochloric acid does not exceed a predetermined concentration of hydrochloric acid; or
      iii. a sum of the predetermined concentration of phosphoric acid and the resulting concentration of hydrochloric acid in the acid bath solution does not exceed a first predetermined limit.

13. The method as in claim 12, Wherein the predetermined concentration of phosphoric acid in the bath solution is between 30% and 50% by volume.

14. The method as in claim 12, wherein the predetermined concentration of hydrochloric acid is between 30% and 50% by volume.

15. The method as in claim 12, wherein the first predetermined limit is between 60% and 95% by volume.

16. The method as in claim 12, further comprising draining a portion of the acid bath solution if the effectiveness of the acid bath solution is below a predetermined performance standard.

17. The method as in claim 12, further comprising comparing a sum of the concentration of phosphoric acid and the concentration of hydrochloric acid in the acid bath solution to a second predetermined limit.

18. A method for refreshing an acid bath solution comprising:
   a. draining a portion of the acid bath solution to create a remaining acid bath solution;

b. determining a concentration of phosphoric acid in a sample of the remaining acid bath solution via titration;
c. determining a concentration of hydrochloric acid in the sample remaining acid bath solution via titration;
d. calculating a volume of phosphoric acid to add to the remaining acid bath solution based upon the concentration of the phosphoric acid to achieve a predetermined concentration of phosphoric acid in the remaining acid bath solution;
e. calculating a volume of hydrochloric acid to add to the remaining acid bath solution with the volume of phosphoric acid based upon the concentration of the hydrochloric acid to increase the remaining acid bath solution to a predetermined volume; and
f. adding the volume of phosphoric acid and the volume of hydrochloric acid to the remaining acid bath solution.

19. The method as in claim 18, wherein the predetermined concentration of phosphoric acid in the bath solution is between 30% and 50% by volume.

20. The method as in claim 18, further comprising draining a portion of the acid bath solution if the effectiveness of the acid bath solution is below a predetermined performance standard.

\* \* \* \* \*

UNITED STATES PATENT AND TRADEMARK OFFICE
CERTIFICATE OF CORRECTION

PATENT NO. : 8,877,084 B2
APPLICATION NO. : 13/530155
DATED : November 4, 2014
INVENTOR(S) : Liming Zhang, Hong Zhou and Yanping Liu It is certified that error appears in the above-identified patent and that said Letters Patent is hereby corrected as shown below:

In the Claims

Claim 1, column 9, line 32 reads "a. determining a concentration of phosphoric acid in as" should read --a. determining a concentration of phosphoric acid in a--

Claim 12, column 10, line 23 reads "b. determining a concentration Hofhydrochloric acid in the" should read --b. determining a concentration of hydrochloric acid in the--

Claim 13, column 10, line 48 reads "The method as in claim 12, Wherein the predetermined" should read --The method as in claim 12, wherein the predetermined--

Claim 18, column 11, line 4 reads "sample remaining acid bath solution via titration;" should read --sample of the remaining acid bath solution via titration;--

Signed and Sealed this
Twenty-sixth Day of May, 2015

Michelle K. Lee
*Director of the United States Patent and Trademark Office*